United States Patent
Zhang (10) Patent No.: US 11,011,632 B2
(45) Date of Patent: May 18, 2021

(54) HIGH VOLTAGE DEVICES AND METHODS OF FORMING THE SAME

(71) Applicant: GLOBALFOUNDRIES Singapore Pte. Ltd., Singapore (SG)

(72) Inventor: Guowei Zhang, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 41 days.

(21) Appl. No.: 16/211,327

(22) Filed: Dec. 6, 2018

(65) Prior Publication Data

US 2020/0185521 A1   Jun. 11, 2020

(51) Int. Cl.
*H01L 29/78* (2006.01)
*H01L 29/423* (2006.01)
*H01L 29/10* (2006.01)
*H01L 29/06* (2006.01)

(52) U.S. Cl.
CPC ...... *H01L 29/7816* (2013.01); *H01L 29/0607* (2013.01); *H01L 29/0696* (2013.01); *H01L 29/1095* (2013.01); *H01L 29/42368* (2013.01)

(58) Field of Classification Search
CPC ... H01L 29/0607–0638; H01L 29/7816–7826; H01L 29/0696; H01L 29/1095; H01L 29/66681–66704
See application file for complete search history.

(56) References Cited

U.S. PATENT DOCUMENTS

| | | | |
|---|---|---|---|
| 6,870,222 B2 | 3/2005 | Kim et al. | |
| 2001/0025987 A1* | 10/2001 | Akaishi | H01L 21/266 257/343 |
| 2004/0089897 A1 | 5/2004 | Johansson et al. | |

OTHER PUBLICATIONS

Cheon Soo Kim et al., "Trenched-Sinker LDMOSFET (TS-LDMOS) Structure for 2 GHz Power Amplifiers", ETRI Journal, Jun. 2003, pp. 195-202, vol. 25, No. 3.

* cited by examiner

*Primary Examiner* — Amar Movva
(74) *Attorney, Agent, or Firm* — Viering Jentschura & Partner Mbb (57) ABSTRACT

A device which includes a substrate having a device region is provided. The device region may be a high voltage device region. A source region and a drain region are disposed in the substrate within the device region. A gate is arranged over the substrate and between the source region and the drain region. A trench structure having a trench is disposed in the substrate within the device region. The trench structure is arranged on a first side of the gate where a predetermined distance is arranged between the trench structure and the first side of the gate. A well tap region is disposed adjacent to the source region. The well tap region is arranged at least around a bottom and a sidewall of the trench. The well tap region has a deeper depth within the substrate as compared to the source region.

14 Claims, 9 Drawing Sheets

HIGH VOLTAGE DEVICES AND METHODS OF FORMING THE SAME

TECHNICAL FIELD

The present disclosure relates generally to high voltage devices and methods of forming the same.

BACKGROUND

High voltage devices, such as lateral double-diffused metal oxide semiconductors (LDMOS) devices, have been widely employed for high voltage applications such as power amplifiers for mobile communication. A conventional LDMOS device may include sinker regions to reduce parasitic resistance and parasitic capacitance. However, forming sinker regions in such conventional LDMOS devices involve additional processing steps and manufacturing costs for the LDMOS device. For example, the LDMOS employs sinkers, which are formed by providing a doped epitaxial layer over a substrate, etching a trench through the source area of the doped epitaxial layer and filling the trench with a heavily doped polysilicon process. Such process steps undesirably increase manufacturing cost for the device as additional masks are required.

From the foregoing discussion, it is desirable to provide a reliable, simplified and cost effective high voltage device and methods of forming.

SUMMARY

Embodiments generally relate to semiconductor devices and methods of forming thereof. In one embodiment, the device may include a substrate having a device region. A source region and a drain region may be disposed in the substrate within the device region. A gate may be arranged over the substrate and between the source region and the drain region. A trench structure having a trench may be disposed in the substrate within the device region. The trench structure may be arranged on a first side of the gate where a predetermined distance is arranged between the trench structure and the first side of the gate. A well tap region may be disposed adjacent to the source region. The well tap region may be arranged at least around a bottom and a sidewall of the trench. The well tap region may have a deeper depth within the substrate as compared to the source region.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following.

DETAILED DESCRIPTION

The following detailed description refers to the accompanying drawings that show, by way of illustration, specific details and embodiments in which the embodiments may be practiced. These embodiments are described in sufficient detail to enable those skilled in the art to practice the embodiments. Other embodiments may be utilized and structural, logical, and electrical changes may be made without departing from the scope of the invention. The various embodiments are not necessarily mutually exclusive, as some embodiments can be combined with one or more other embodiments to form new embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled,"

however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Embodiments of the present disclosure generally relate to semiconductor devices or integrated circuits (ICs). More particularly, some embodiments relate to high voltage devices. The high voltage devices may include high voltage transistors, such as lateral double-diffused metal oxide semiconductor (LDMOS) transistors. Other suitable high voltage devices may also be useful. The high voltage devices may be employed as switching voltage regulators for power management applications. Embodiments may relate to the high voltage devices having a deeper well tap region. The deeper well tap region may reduce well tap resistance, which improves the reliability of the LDMOS device to snap back and the safe operating area of the LDMOS device. Furthermore, there is no need for additional mask to form the deeper well tap region. This simplifies the manufacturing process and optimizes the manufacturing cost. Such devices may be incorporated into ICs. The devices or ICs may be incorporated into or used with, for example, consumer electronic products, such as smart phones, tablets, personal digital assistants (PDA), and other suitable types of products.

Figure 1A:
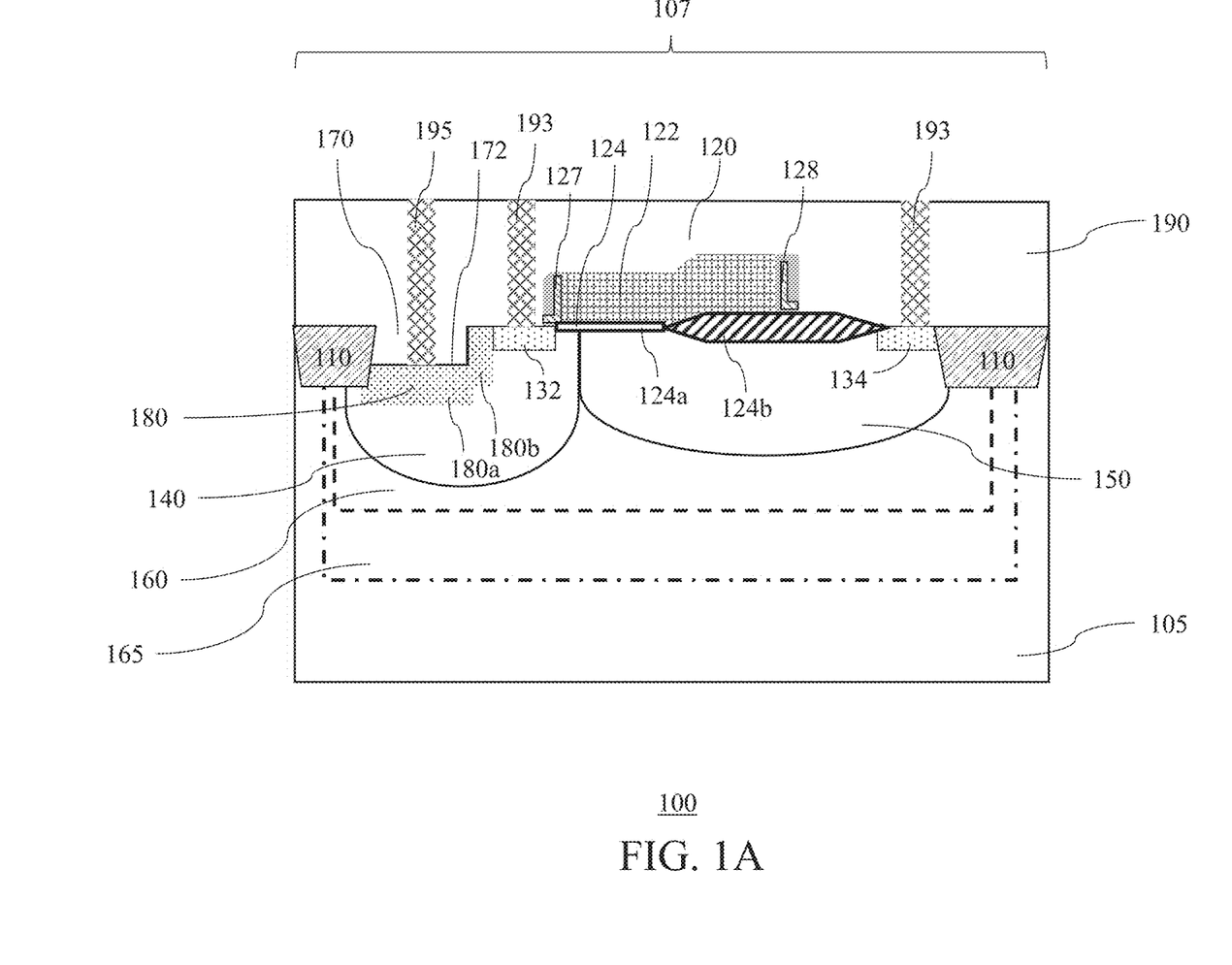
FIGS. 1A-1B show cross-sectional views of embodiments of a device.
Figure 1B:
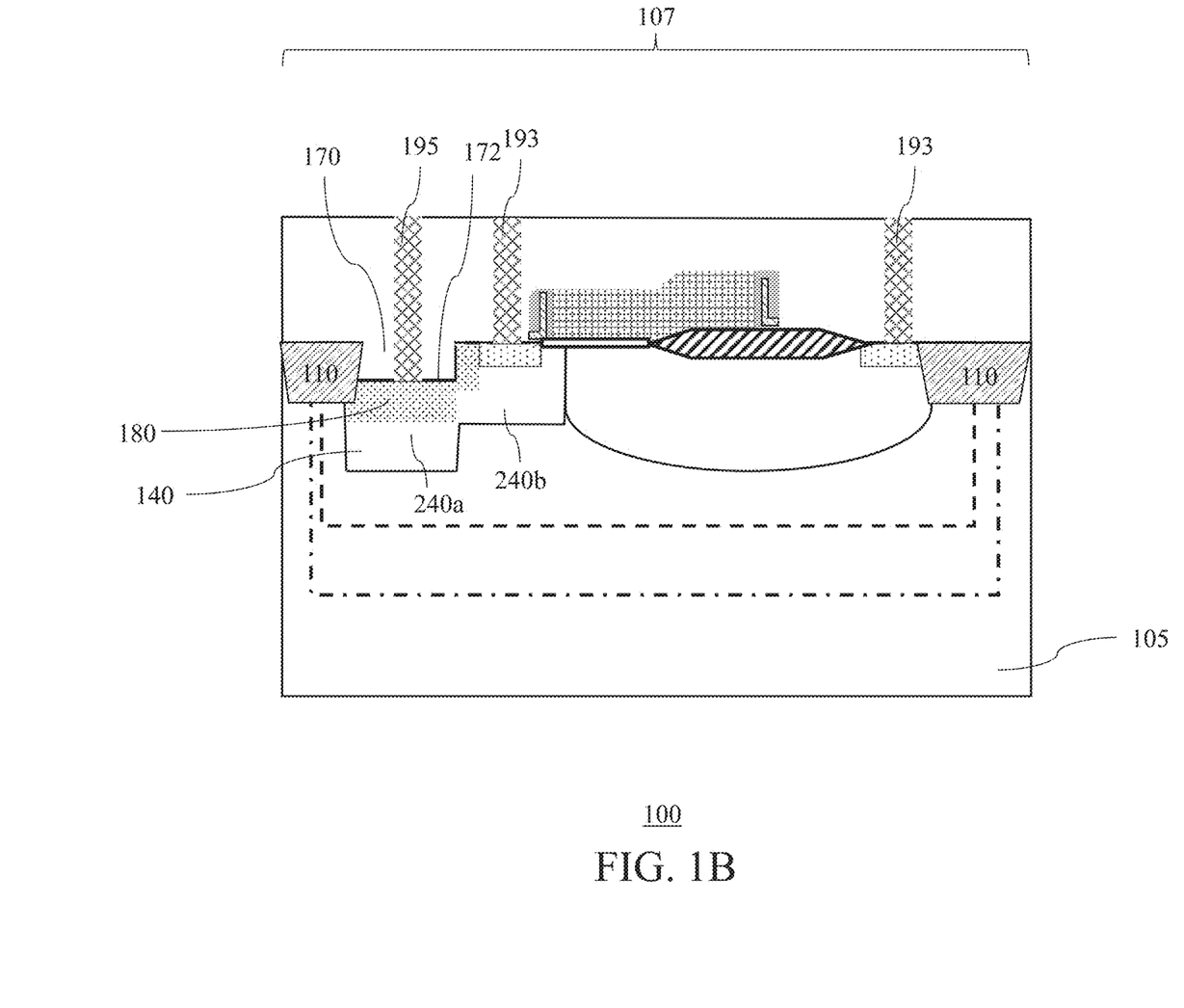

FIGS. 1A-1B show cross-sectional views of embodiments of a device 100. The device, for example, is an IC. Other types of devices may also be useful. As shown, the device includes a substrate 105. The substrate 105 may be a semiconductor substrate, such as a silicon substrate in a non-limiting embodiment. Other types of substrates, such as silicon germanium, germanium, gallium arsenide, or crystal-on-insulator (COI) such as silicon-on-insulator (SOI), may also be used. In a non-limiting embodiment, the substrate may be a doped substrate. The substrate may be doped with second polarity type dopants. For example, the substrate may be lightly doped with second polarity type dopants. The second polarity type dopants, for example, are p-type dopants. Alternatively, the second polarity type dopants may be n-type dopants. P-type dopants can include boron (B), aluminum (Al), indium (In) or a combination thereof, while n-type dopants may include phosphorus (P), arsenic (As), antimony (Sb), or a combination thereof. Providing a substrate with other types of dopants or dopant concentrations as well as an undoped substrate, may also be useful.

In one embodiment, the substrate 105 may include a device region 107. The device region 107, for example, is a high voltage (HV) device region for HV devices, such as HV transistors. The device region 107 may be prepared for devices operating in high voltage ranges, for example, at a voltage ranging of about 12V to about 200V. Other suitable voltage values may also be useful. In a non-limiting embodiment, a HV device includes a lateral double-diffused metal oxide semiconductor (LDMOS) transistor. Other suitable high voltage devices may also be useful. In a non-limiting example, the device region includes a first polarity type LDMOS transistor. The first polarity type is different or opposite to the second polarity type. For example, in the case the first polarity type dopants are n-type dopants, the second polarity type dopants are p-type dopants. Alternatively, in the case the first polarity type dopants are p-type dopants, the second polarity type dopants are n-type dopants. In a non-limiting example, the first polarity type LDMOS transistor may be a LDNMOS transistor. Alternatively, the first polarity type LDMOS may be a LDPMOS transistor. The substrate may also be prepared with other suitable types of regions (not shown) for other types of circuitry, depending on the type of device or IC. For example, the substrate may include regions for intermediate or medium voltage (MV) and low voltage (LV) devices. For simplicity and illustration purpose, only the high voltage device region is shown.

Device isolation regions 110 may be provided for isolating or separating the device region 107 from other regions of the substrate. For example, the device isolation regions 110 surround the device region 107. In one non-limiting embodiment, the device isolation regions 110 may be shallow trench isolation (STI) regions. An STI region may include an isolation trench filled with isolation or dielectric materials, such as a gap fill oxide, a nitride, or a combination thereof in a non-limiting example. Other suitable types of isolation regions, such as deep trench isolation (DTI) regions filled with polysilicon, may also be employed. The STI regions, for example, extend to a depth of about 0.3 um to about 0.4 um from a top surface of the substrate. Providing device isolation regions which extend to other suitable depths may also be useful.

A gate 120 of the LDMOS transistor may be disposed over the substrate. The gate may include first and second sides. The gate 120 may include a gate electrode 122 over a gate dielectric 124. In a non-limiting embodiment, the gate dielectric 124 may include a first gate dielectric portion 124a and a second gate dielectric portion 124b. The second gate dielectric portion 124b may be thicker than the first gate dielectric portion 124a. In a non-limiting embodiment, the second gate dielectric portion 124b extends under the gate beyond the second side of the gate. The gate dielectric 124 may be formed of an oxide layer, such as silicon oxide while the gate electrode 122 may be polysilicon in a non-limiting example. Providing other types of material for the gate electrode and the gate dielectric may also be useful. In some embodiments, the gate electrode may be a doped electrode. For example, n-type dopants may be used to dope the gate electrode of NMOS transistor, while p-type dopants may be used to dope the gate electrode of PMOS transistor. Other suitable types of gate dielectrics and gate electrodes, as well as thicknesses, may also be useful.

A first gate spacer 127 and a second gate spacer 128 may be provided on sidewalls of the gate electrode 122. The gate spacers may be dielectric spacers, such as silicon oxide spacers, in a non-limiting example. Other suitable types of dielectric materials may also be useful, such as silicon nitride or a combination of dielectric materials or layers. For example, the spacers may be single or composite spacers. Other configurations of spacers may also be useful.

A source region 132 and a drain region 134 may be disposed in the substrate within the device region. As illustrated in FIGS. 1A-1B, the gate 120 is arranged between the source and drain regions. In a non-limiting embodiment, the source region 132 is disposed adjacent to the first side of the gate and the drain region 134 is disposed spaced apart from the second side of the gate. In a non-limiting embodiment, the source region 132 may underlap a portion of the gate 120. The underlap portion should be sufficient for the source region to be in communication with a channel under the gate. In a non-limiting embodiment, the drain region 134 may abut the second gate dielectric portion 124b. For example, the second gate dielectric portion 124b may displace the drain region from a second side of the gate.

The source region 132 and the drain region 134 may be doped with first polarity type dopants for a first polarity type transistor. The source region 132 and the drain region 134 may be heavily doped regions. For example, for a LDNMOS, the source region 132 and the drain region 134 may be heavily doped n-type (n$^+$) regions, while for a LDPMOS, the source region 132 and the drain region 134 may be heavily doped p-type (p$^+$) regions. The heavily doped regions may have a dopant concentration ranging from about 1E15/cm$^2$ to about 1E17/cm$^2$, in a non-limiting example. Other suitable dopant concentrations for the source and drain regions may also be useful. In a non-limiting example, the depth of the source and drain regions may range from about 0.1 um to about 0.4 um from the top surface of the substrate. Providing source and drain regions having other suitable depths may also be useful. Additionally, providing source and drain regions having different depths may also be useful.

A first device well 140 may be disposed in the substrate within the device region 107. The first device well 140 may serve as a body well of the transistor. The first device well 140 may be disposed adjacent to the first side of the gate 120 and extends at least partially under a first portion of the gate 120. For example, the first device well 140 may extend beyond the source region 132 and may underlap the first side of the gate 120. As shown, the first device well 140 may surround the source region 132. In a non-limiting embodiment, a depth or bottom of the first device well 140 may be below the source region 132.

The first device well 140 may be lightly or intermediately doped with second polarity dopants for a first polarity type transistor. For example, the body well comprises p-type dopants for an n-type transistor or n-type dopants for a p-type transistor. In a non-limiting example, the dopant concentration of the first device well may range from about 1E13/cm$^2$ to about 5E14/cm$^2$. Other dopant concentrations may also be useful. The dopant concentration may depend on, for example, the maximum voltage requirement of the device. In a non-limiting embodiment, the first device well may have a depth deeper than the device isolation regions. The depth of the first device well 140 may be range about 0.5 um to about 1 um from the top surface of the substrate in a non-limiting example. Other suitable depth dimensions may also be useful.

A second device well 150 may be disposed in the substrate within the device region 107. The second device well 150 serves as a drift region or drift well. In a non-limiting embodiment, the second device well 150 may surround the drain region and extends at least partially under a second portion of the gate 120. In one non-limiting embodiment, the depth or bottom of the second device well 150 is below the drain region from the substrate surface. In one non-limiting embodiment, the second device well 150 may extend from the top substrate surface to a depth deeper than the device isolation regions 110. The depth of the second device well 150 may range from about 0.5 um to about 3 um. Other depth dimensions may also be useful. The depth, for example, may depend on the design voltage of the device. The substrate portion under the gate 120 disposed between the source region 132 and second device well 150 may form a channel region of the transistor.

The second device well 150 includes first polarity type dopants for a first polarity type transistor. For example, the second device well 150 may include n-type dopants for an n-type transistor or p-type dopants for a p-type transistor. In a non-limiting embodiment, the dopant concentration of the second device well 150 is lower than the dopant concentration of the drain region. In a non-limiting embodiment, the second device well 150 may be lightly doped. For example, the dopant concentration of the second device well 150 may range from about 1E12/cm$^2$ to about 5E13/cm$^2$. Other suitable dopant concentrations may also be useful. For example, the dopant concentration of the second device well 150 may depend on the maximum or breakdown voltage requirement of the device.

As illustrated in FIG. 1A, the first device well 140 may extend along the channel length direction under the gate 120 to about the inner edge of the second device well 150. For example, the inner edge of the first device well 140 under the gate may be contiguous with the inner edge of the second device well 150. Other configurations of the first device well 140 and the second device well 150 may also be useful. Although the first and second device wells 140, 150 are shown to be contiguous, in other alternative embodiments, the first device well 140 may also extend to surround or encompass the second device well 150. For example, the first device well 140 may extend beyond the second device well 150 and have a depth deeper than the second device well 150. In other embodiments, the depth of the first device well 140 may be the same or shallower than the depth of the second device well 150.

In some embodiments, a third device well 160 and a fourth device well 165 may be disposed in the substrate within the device region 107. The third device well 160 may surround or may encompass the first device well 140, second device well 150, source region 132, and drain region 134. The third device well 160 and fourth device well 165 may serve as HV device wells for the HV device region 107. The depth or bottom of the third device well 160 may be below the first and second device wells 140 and 150. As for the fourth device well 165, it may surround or may encompass the third device well 160.

In a non-limiting embodiment, the third device well 160 may include second polarity type dopants for a first polarity type device, while the fourth device well 165 may include first polarity type dopants for the first polarity type device. For example, the third device well 160 may include p-type dopants for an n-type transistor, while the fourth device well 165 may include n-type dopants for an n-type transistor. For example, in the case of an NMOS, the third device well 160 may serve as a HVPWELL, while the fourth device well 165 may serve as a HVNWELL. Alternatively, in the case of a PMOS, the third device well 160 may serve as a HVNWELL, while the fourth device well 165 may serve as a HVPWELL.

The third and fourth device wells 160 and 165 may be lightly doped. In a non-limiting example, the dopant concentration of the third device well 160 may range from about 1E12/cm$^2$ to about 1E13/cm$^2$, while the dopant concentration of the fourth device well 160 may range from about 1E12/cm$^2$ to about 1E13/cm$^2$. For example, the third and fourth device wells 160 and 165 may have a similar dopant concentration or greater than that of the lightly doped substrate 105. Other configurations of the third and fourth device wells may also be useful.

In a non-limiting embodiment, a trench structure 170 may be disposed in the substrate within the device region. As shown in FIG. 1A, the trench structure 170 may be disposed within the first device well 140. The trench structure may be arranged on a first side of the gate. In a non-limiting embodiment, the trench structure is displaced from the first side of the gate by a predetermined distance, such as but not limited to a predetermined distance ranging from about 0.2 um to about 0.7 um. As illustrated, a predetermined distance may be arranged between the trench structure and the source region 132. The trench structure may include a trench 172 filled with dielectric material. The dielectric material may be an oxide, such as silicon oxide. Providing other types of dielectric material in the trench structure 170 may also be useful. The trench structure may have a depth ranging from about 0.1 um to about 0.3 um from the top surface of the substrate. In a non-limiting embodiment, the trench structure 170 may have a depth deeper than the source region 132 from the top surface of the substrate. Providing the trench structure 170 having a same depth or shallower than the source region 132 may also be useful. In a non-limiting embodiment, the trench structure 170 may have a depth shallower than the depth of the device isolation structures 110 from the top surface of the substrate. Other depths for the trench structure may also be useful.

In a non-limiting embodiment, a well tap region 180 may be disposed within the first device well 140 in the substrate and in communication with the first device well. The first device well 140 may surround the well tap region 180. The well tap region 180 may serve to bias the first device well 140. The well tap region 180 may be disposed between the source region 132 and a device isolation region 110. As shown, the well tap region 180 may surround the trench 172 (or trench structure 170) in the substrate 105. For example, the well tap region 180 is arranged at least around a bottom and a sidewall of the trench 172. As illustrated, the well tap region 180 is arranged at least around a bottom and a sidewall of the trench structure 170. The well tap region 180, in a non-limiting embodiment, may be adjacent to the source region 132. The well tap region 180, in a non-limiting embodiment, may abut the source region 132. In other embodiments, the well tap region 180 may be spaced apart from the source region 132.

The well tap region 180 may include a first well tap portion 180a below the trench 172 and a second well tap portion 180b adjacent to the trench 172 in the substrate. The first well tap portion 180a may extend from a bottom of the trench 172 (or bottom surface of the trench structure 170) and into a portion of the substrate, while the second well tap portion 180b may extend from the top surface of the substrate and into a portion of the substrate. In a non-limiting embodiment, the well tap region 180 may have a depth deeper than the source region 132 relative to the top surface of the substrate. Further, a bottom of the first well tap portion 180a may extend below a bottom of the device isolation region 110. In other words, a depth of the well tap region 180 may be deeper than a depth of the device isolation region from the top surface of the substrate. In a non-limiting example, the well tap region 180 may have a depth ranging from about 0.1 um to about 0.3 um. For example, the first well tap portion 180a below the trench 172 may have a depth ranging from about 0.2 um to about 0.6 um relative to the top surface of the substrate in the case where the trench 172 has a depth ranging from about 0.1 um to about 0.3 um relative to the top surface of the substrate. As for the second well tap portion 180b, it may have a depth ranging from about 0.1 um to about 0.3 um relative to the top surface of the substrate. In other words, the deepest depth of the well tap region 180 may range from about 0.2 um to about 0.6 um relative to the top surface of the substrate.

Other suitable depth dimensions may also be useful. Providing a trench 172 of the trench structure 170 in the device enables the well tap region 180 to be disposed deeper into the substrate. A deeper well tap region may reduce well tap resistance.

The well tap region 180 may have the same polarity type as the first device well 140. For example, the well tap region 180 may be a second polarity type well tap region for a first polarity type transistor. For example, the well tap region 180 may be doped with p-type dopants for an n-type transistor. Alternatively, the well tap region 180 may be doped with n-type dopants for a p-type transistor. In a non-limiting embodiment, the well tap region 180 may be a heavily doped region, similar to the source and drain regions. The dopant concentration of the well tap region may range from about $1E15/cm^2$ to about $1E17/cm^2$ in a non-limiting example.

In some embodiments, metal silicide contacts may be provided over the gate electrode, source regions, drain regions, and well tap region (not shown). The silicide contacts, for example, may be or include, but are not limited to a nickel-based silicide, a cobalt silicide (CoSi), and combinations thereof. Other suitable types of metal silicide contacts may also be useful. The silicide contacts may be employed to reduce contact resistance and facilitate contact to back-end-of-line (BEOL) metal interconnects.

A dielectric layer 190 may be disposed over the substrate, covering the gate 120 and top surface of the substrate. The dielectric layer may be formed in a BEOL processing in a non-limiting example. The dielectric layer, in a non-limiting embodiment, serves as a pre-metal dielectric (PMD) layer. The dielectric layer may be an oxide layer, such as a silicon oxide layer, in a non-limiting embodiment. Other suitable types of dielectric materials are also useful. The dielectric layer 190 and trench structure 170, for example, may be formed of the same dielectric material. Providing the dielectric layer 190 and trench structure 170 formed of different dielectric materials may also be useful.

The PMD layer may include contacts 193 coupled to the source and drain regions 132 and 134, and contact 195 coupled to the well tap region 180. In a non-limiting embodiment, the contact 195 may extend through the trench structure 170 to contact the well tap region 180. For example, the contact 195 may extend from the top surface of the substrate and through the trench structure 170 to contact the well tap region 180. The contacts 193 and 195, for example, may be formed of tungsten. Other suitable types of conductive material may also be useful. An inter-metal dielectric (IMD) layer (not shown) may be provided over the PMD layer. The IMD layer, for example, may be an oxide layer, such as a silicon oxide layer. Other types of IMD dielectric materials may also be useful. An etch stop layer, such as silicon nitride, may be provided between the IMD and PMD layers in a non-limiting embodiment. The IMD layer may include conductive lines disposed in the IMD layer which interconnect to the contacts 193 and 195. Other configurations of IMD and PMD layers may also be useful.

FIG. 1B shows a cross-sectional view of another embodiment of the device 100. The device, for example, is similar to that described in FIG. 1A. As such, common elements may not be described or described in detail. In the interest of brevity, the description of the device below primarily focuses on the difference(s) compared with the device as described in FIG. 1A.

The device 100 may include a substrate 105 having a device region 107 surrounded by device isolation regions 110. The device region 107, for example, is a HV device region for a HV transistor, such as a LDMOS transistor.

Similarly, the device region 107 may include a trench structure 170 having a trench 172 disposed in the substrate 105 and a well tap region 180 surrounding the trench 172 (or trench structure 170).

A first device well 140 may be disposed in the substrate within the device region 107. In a non-limiting embodiment, the first device well 140 has a dopant profile which follows the profile of the trench 172 or trench structure 170 and the top surface of the substrate. For example, the first device well 140 may include a first device well portion 240a below the trench 172 and a further first device well portion 240b adjacent to a sidewall of the trench 172, as illustrated in FIG. 1B. The first device well portion 240a may have a depth deeper than a depth of the further first device well portion 240b from the top surface of the substrate. In a non-limiting example, the first device well portion 240a may have a depth ranging from about 0.8 um to about 1.5 um, while the further first device well portion 240b may have a depth ranging from about 0.5 um to about 1 um from the top surface of the substrate.

FIGS. 2A-2D show cross-sectional views of an embodiment of a process 200 for forming a device. The device, for example, is similar to that described in FIG. 1A. As such, common elements may not be described or described in detail.

Figure 2A:
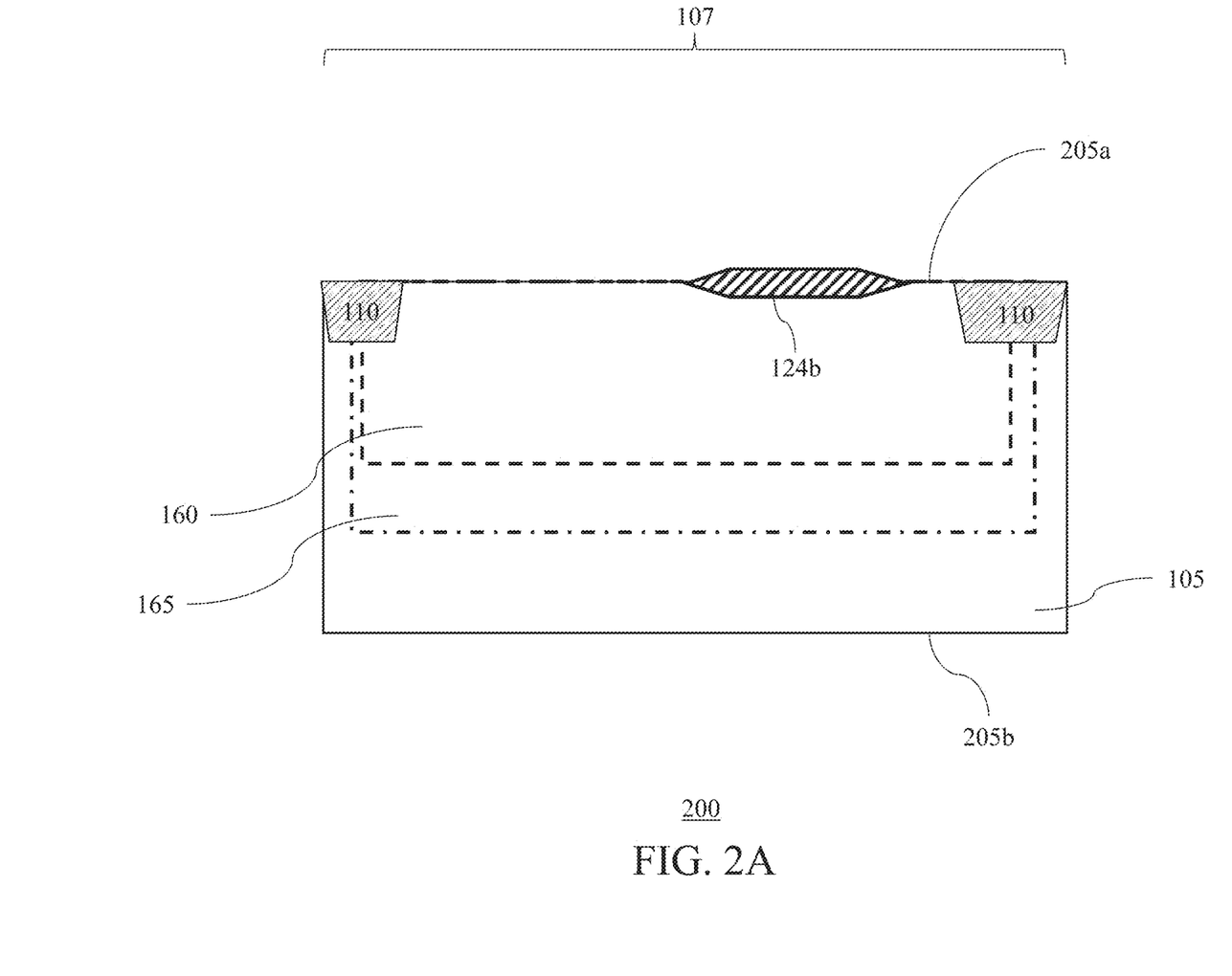
FIGS. 2A-2D show cross-sectional views of an embodiment of a process for forming a device.

Referring to FIG. 2A, a substrate 105 is provided. The substrate 105 may include a first substrate surface 205a and a second substrate surface 205b. The first substrate surface 205a may be a top surface of the substrate while the second substrate surface 205b may be a bottom surface of the substrate. Alternatively, the first substrate surface 205a may be a bottom surface of the substrate while the second substrate surface 205b may be a top surface of the substrate. The substrate 105 may be a semiconductor substrate, such as a silicon substrate in a non-limiting embodiment. The substrate may be a doped substrate. In a non-limiting embodiment, the substrate may be doped with second polarity type dopants for a first polarity type device. For example, the substrate may be lightly doped with second polarity type dopants. Other suitable types of semiconductor substrates may also be useful. The substrate may be doped with other types of dopants or dopant concentrations, including undoped substrates.

The substrate may include a device region 107 defined on the substrate. In a non-limiting embodiment, the device region may be a HV device region for devices operating in high voltage ranges from about 12V to about 200V in a non-limiting example. Other suitable voltage values may also be useful. The device region 107, for example, may serve as a device region for HV transistors. In a non-limiting embodiment, the high voltage transistors, for example, may include LDMOS transistors. Other suitable types of high voltage transistors may also be useful. In a non-limiting example, the device region may include a first polarity type LDMOS transistor. For example, the first polarity type LDMOS transistor may be a LDNMOS transistor. Alternatively, the first polarity type LDMOS may be a LDPMOS transistor. It is understood that the substrate may include other regions (not shown). For example, the substrate may include other device regions for other types of circuitries or devices. Depending on the type of IC formed, the other device regions, for example, may include regions for different voltage devices. For example, the other device regions may include MV regions for MV devices and LV regions for LV devices. Other suitable types of device regions may also be provided.

Device isolation regions 110 may be formed in the substrate. In a non-limiting embodiment, the device isolation regions 110 may be shallow trench isolation (STI) regions. For example, mask and etch techniques may be employed to form isolation trenches in the substrate 105, which are then filled with isolation material. For example, a patterned hard mask may be formed on the substrate. In a non-limiting example, the hard mask may be a hard mask stack, which includes a pad oxide layer and a pad nitride layer. The pad oxide layer may be a silicon oxide layer formed by thermal oxidation in a non-limiting example. As for the pad nitride, it may be a silicon nitride layer formed by chemical vapor deposition (CVD), in a non-limiting example. The pad nitride or upper layer of the mask stack serves as the mask, while the pad oxide promotes adhesion of the upper layer to the substrate. Other suitable types of hard mask or forming techniques may also be useful. For example, patterning the hard mask may be achieved by using a photoresist mask. For example, a photoresist may be patterned by exposing it with an exposure source using a reticle with the desired pattern. After exposure, the photoresist may be developed, transferring the pattern of the reticle to the photoresist. The patterned photoresist may then be used as an etch mask to pattern the hard mask. The patterned hard mask may be used to etch the substrate to form the isolation trenches. Portions of the substrate 105 exposed by openings in the hard mask stack, for example, may be removed by a reactive ion etch (RIE) to form the isolation trenches in a non-limiting embodiment.

A gap fill layer may be deposited over the patterned hard mask, filling the isolation trenches. The gap fill layer, for example, may be deposited by chemical vapor deposition (CVD) under high density plasma (HDP) conditions. The gap fill layer may be or include silicon dioxide or silicon nitride, in a non-limiting example. The gap fill layer may then be planarized by, for example, using a chemical mechanical polishing (CMP) process to remove excess gap fill material oxide, forming the device isolation regions. In some embodiments, a linear oxide layer, such as silicon oxide, may be grown in the isolation trenches prior to depositing the gap fill layer. The patterned hard mask may be removed using for example, a wet etch. For example, the pad nitride layer is removed by, for example, a wet etch selective to the pad oxide layer. Other suitable techniques of removing the pad nitride layer may also be useful. A stripping process may be performed to remove the remaining pad oxide layer to expose the top surface of the substrate. The pad oxide layer, for example, may be removed by a wet etch process, such as HF. Other suitable techniques may be employed for the stripping process.

In a non-limiting embodiment, a third device well 160 and a fourth device well 165 may be formed in the substrate. The fourth device well 165 may be lightly doped with first polarity type dopants, while the third device well 160 may be lightly doped with second polarity type dopants.

The third device well 160 and the fourth device well 165 may be formed by ion implantation. For example, a fourth device well implant mask, such as a patterned photoresist layer may be formed over the substrate 105 to expose a portion of the substrate for forming the fourth device well 165. An ion implantation process is then performed to form the first polarity type fourth device well 165 in the exposed portion of the substrate 105. In a non-limiting example, first polarity type dopants may be implanted in an amount ranging from about $1E12/cm^2$ to about $1E13/cm^2$ at an energy of about 1 Mev to about 5 Mev. Other suitable implant parameters may also be useful for forming the fourth device well 165. The fourth device well implant mask may be removed after forming the fourth device well 165.

A third device well implant mask, such as a patterned photoresist layer may be formed over the substrate 105 to expose a portion of the substrate above the fourth device well 165 for forming the third device well 160. The third device well 160 may be formed by implanting the portion of the substrate above the fourth device well 165 with second polarity type dopants. In a non-limiting example, second polarity type dopants may be implanted in an amount ranging from about $1E12/cm^2$ to about $1E13/cm^2$ at an energy of about 1 Mev to about 3 Mev. Other suitable implant parameters may also be useful for forming the third device well. The third device well implant mask may be removed after forming the third device well 160.

The process continues to form a second gate dielectric portion 124b of a gate of the transistor over the substrate. The second gate dielectric portion 124b may be formed by a local oxidation of silicon (LOCOS) process on a portion of the substrate. For example, a patterned mask having an opening for forming the second gate dielectric portion 124b may be formed over the substrate. In a non-limiting example, a pad oxide layer may be formed over the substrate, and a hard mask layer may be formed over the pad oxide layer. Photolithography may subsequently be performed to etch the pad oxide layer and the hard mask layer using a photoresist mask in a non-limiting example to expose the portion of the substrate for forming the second gate dielectric portion 124b. A layer of thermal oxide may be subsequently grown in the exposed portion of the substrate. In a non-limiting embodiment, the layer of thermal oxide may be grown over a portion of the substrate where a drift region or drift well is to be formed later. The local oxidation oxidises the portion of the substrate for forming the second gate dielectric portion 124b. Other techniques for forming the second gate dielectric portion may also be useful. The patterned hard mask may be removed using for example, a wet etch. For example, the pad nitride layer is removed by, for example, a wet etch selective to the pad oxide layer. Other suitable techniques for removing the pad nitride layer may also be useful. A stripping process may be performed to remove the remaining pad oxide layer. The pad oxide layer, for example, may be removed by a wet etch process, such as HF. Other suitable techniques may be employed for the stripping process.

Figure 2B:
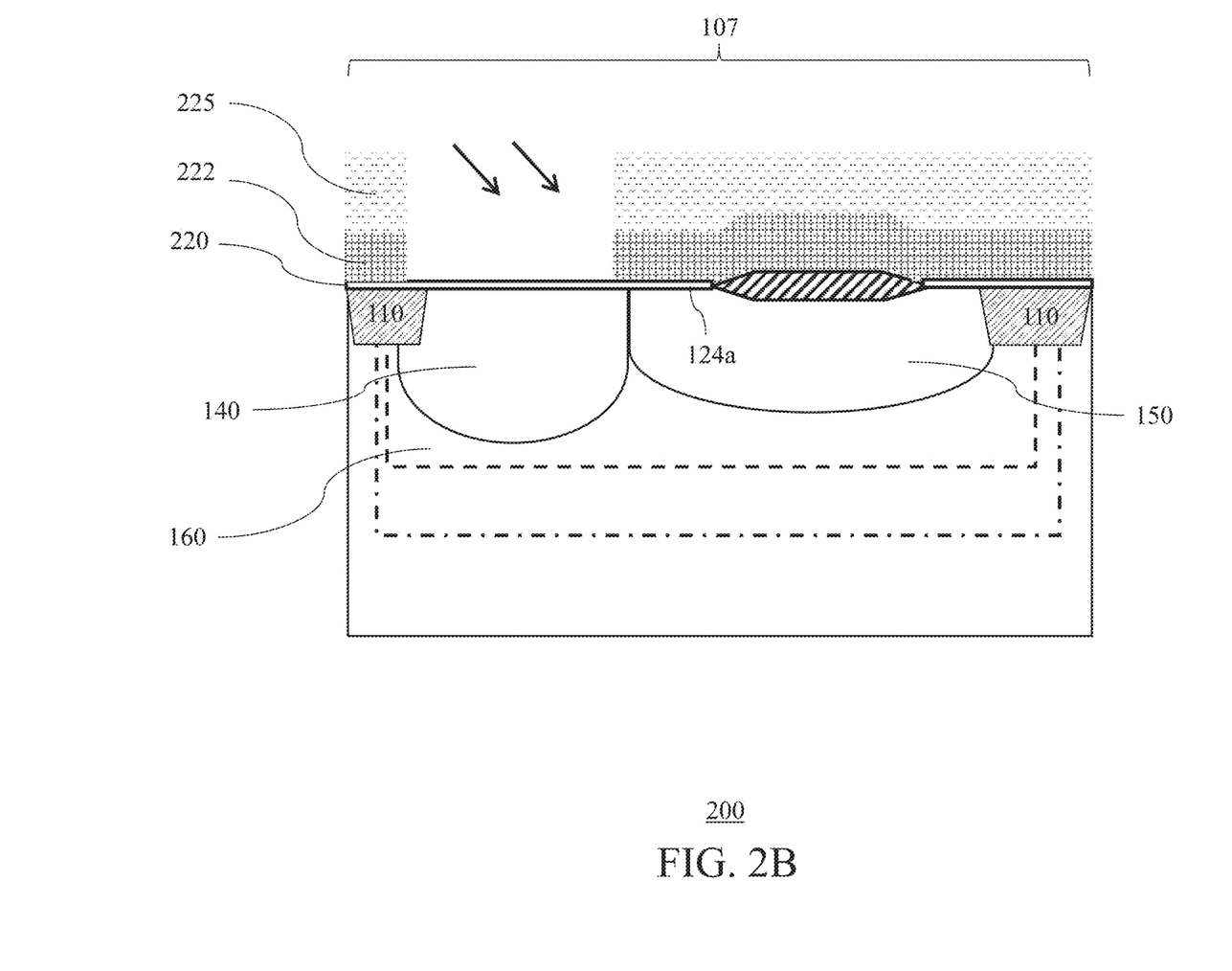

A second device well 150 may be formed in the substrate, as illustrated in FIG. 2B. The second device well may serve as a drift region or drift well. In a non-limiting embodiment, the second device well 150 may be formed within the third device well 160. The depth of the second device well 150, for example, is less than the depth of the third device well 160. In a non-limiting embodiment, the depth or bottom of the second device well may be below the device isolation regions. Other suitable depths for the second device well may also be useful. The second device well 150, for example, may include first polarity type dopants. In one embodiment, the second device well 150 is lightly doped. The second device well 150 may be formed by ion implantation. A second device well implant mask, such as a patterned photoresist layer may be formed over the substrate 105 to expose a portion of the substrate for forming the second device well 150. The second device well 150 may be formed by implanting the portion of the substrate above the third device well 160 with first polarity type dopants. In a non-limiting example, first polarity type dopants may be implanted in an amount ranging from about $1E12/cm^2$ to about $5E13/cm^2$ at an energy of about 500 Kev to about 1 Mev. Other suitable implant parameters may also be useful for forming the second device well. The second device well implant mask may be removed after forming the second device well 150.

A first gate dielectric portion 124a may be formed over the substrate 105. In a non-limiting embodiment, the first gate dielectric portion 124a may be formed by growing an oxide layer 220 on the substrate using thermal oxidation. In other embodiments, CVD may be employed to deposit the oxide layer 220 such as a silicon oxide layer, in a non-limiting example.

A gate electrode layer 222 may then be formed over the substrate. The gate electrode layer 222 may be a polysilicon layer in a non-limiting example. The gate electrode layer 222 may be deposited over the substrate by CVD. Other conductive material and techniques suitable for forming the gate electrode layer may also be useful.

The process continues to form a first device well 140 in the substrate, as illustrated in FIG. 2B. The first device well 140 may serve as a body well of the transistor. In a non-limiting embodiment, an ion implantation process may be performed to form the first device well 140. A first device well implant mask 225, such as a patterned photoresist layer may be formed over the substrate 105. The patterned photoresist layer may include an opening that corresponds to a region of the substrate where the first device well 140 is to be formed. A portion of the gate electrode layer exposed by the patterned photoresist layer may be removed to expose a portion of the substrate for forming the first device well 140. The portion of the gate electrode layer may be removed, for example, by an etching process.

The ion implantation process may be performed on the exposed portion of the substrate above the third device well 160. The implant, in a non-limiting example, is a high tilt angled implant. In a non-limiting embodiment, the implant forms the first device well 140 within the third device well 160. The first device well 140 may be formed by implanting the exposed portion of the substrate with second polarity type dopants, in a non-limiting embodiment. In a non-limiting embodiment, the first device well 140 and the third device well 160 may have the same polarity type dopants. In a non-limiting embodiment, the first device well 140 may be a lightly or intermediately doped device well. The implant amount may range from about $1E13/cm^2$ to about $5E14/cm^2$ and the implant energy may range from about 50 Kev to about 500 Kev. Other suitable implant parameters may also be useful for forming the first device well.

As illustrated, the implant may be angled to form the first device well 140. In a non-limiting example, the implant may be performed at an angle ranging from about 15° to about 45° with reference to the top surface of the substrate. Other angled implants may also be useful. The angled implant may form a first device well 140, which extends under a portion of the gate electrode layer 222. As shown, the first device well 140 may extend from the top surface of the substrate and beyond the bottom of the device isolation regions, in a non-limiting embodiment. The depth of the first device well 140 may range from about 0.5 um to about 1 um, in a non-limiting example. The depth of the first device well 140, for example, may be less than the depth of the third device well 160. Other suitable depth dimensions may also be useful. The first device well implant mask 225 may be removed, for example, by ashing in the case of a photoresist layer. Other suitable techniques for removing the photoresist may also be useful.

Figure 2C:
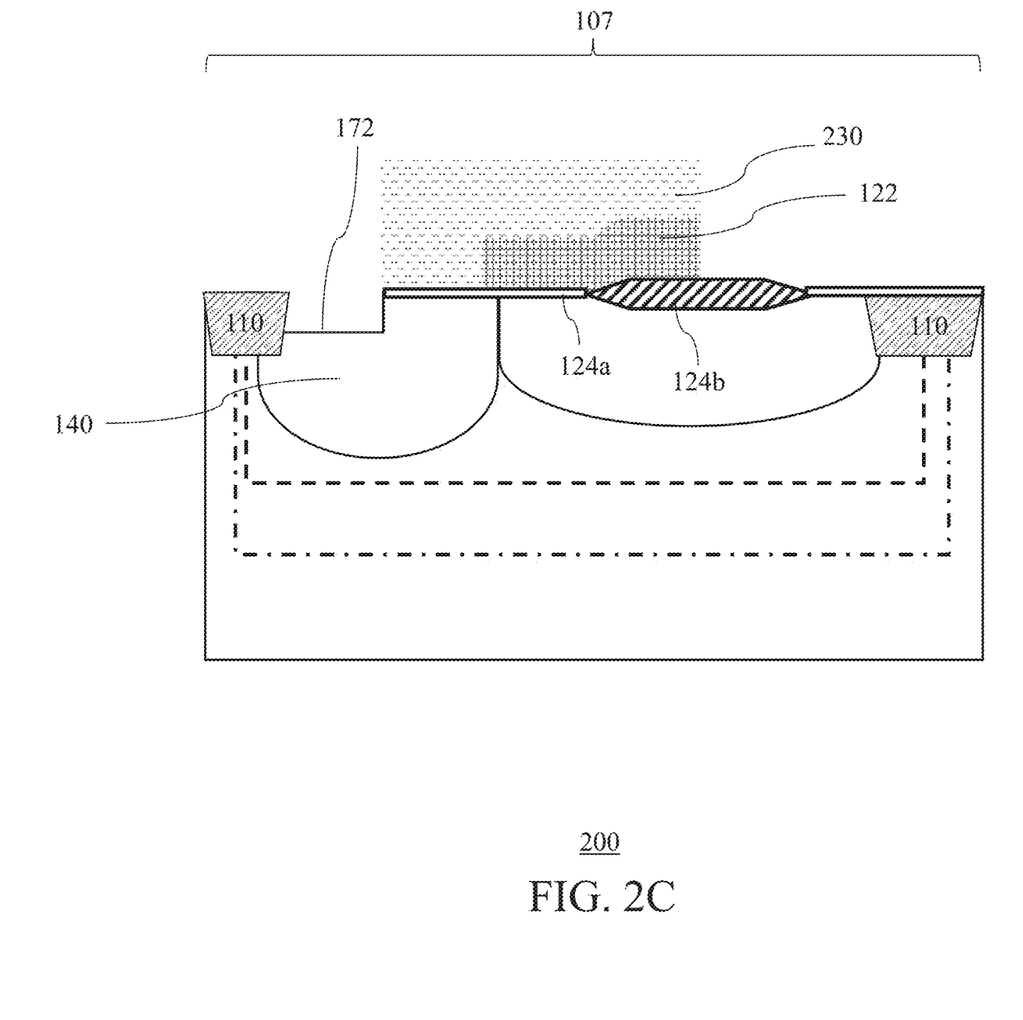

The substrate may be patterned to form a trench 172 of a trench structure in the first device well 140, and the gate electrode layer may be patterned to form a gate electrode 122 of the HV device in the device region 107, as illustrated in FIG. 2C. In a non-limiting embodiment, patterning the substrate to form the trench 172 within the first device well 140 in the substrate, and the gate electrode layer to form the gate electrode 122, may be performed simultaneously. In a non-limiting embodiment, a mask and etch technique may be employed to pattern the substrate and the gate electrode layer in the device region 107. In some embodiments, patterning of the gate electrode layer to form the gate electrode 122 in the device region 107 and the substrate 105 to form the trench 172 of the trench structure may be performed simultaneously. Additionally, patterning of the gate electrode layer to form the gate electrode 122 in the device region 107 and the substrate 105 to form the trench 172 of the trench structure may be performed simultaneously with patterning other regions of the substrate 105 (e.g., gate electrode patterning for input output device region, and core device region of the substrate).

A gate mask 230, such as a patterned photoresist layer may be formed over the substrate 105. The gate mask 230 covers a portion of the gate electrode layer for forming the gate electrode 122, while exposing portions of the gate electrode layer which are to be removed. The gate mask also covers a portion of the substrate, while exposing the portion of the substrate where the trench 172 is to be formed above the first device well 140. The gate mask may also cover portions of the substrate in other regions (not shown) and expose portions of those regions to be removed. Exposed portion of the substrate and the gate electrode layer may be removed, for example, by an anisotropic etch such as a RIE. Other techniques for etching may also be useful. The gate mask may be removed, for example, by ashing in the case of a photoresist layer. Other suitable techniques for removing the gate mask may also be useful.

Figure 2D:
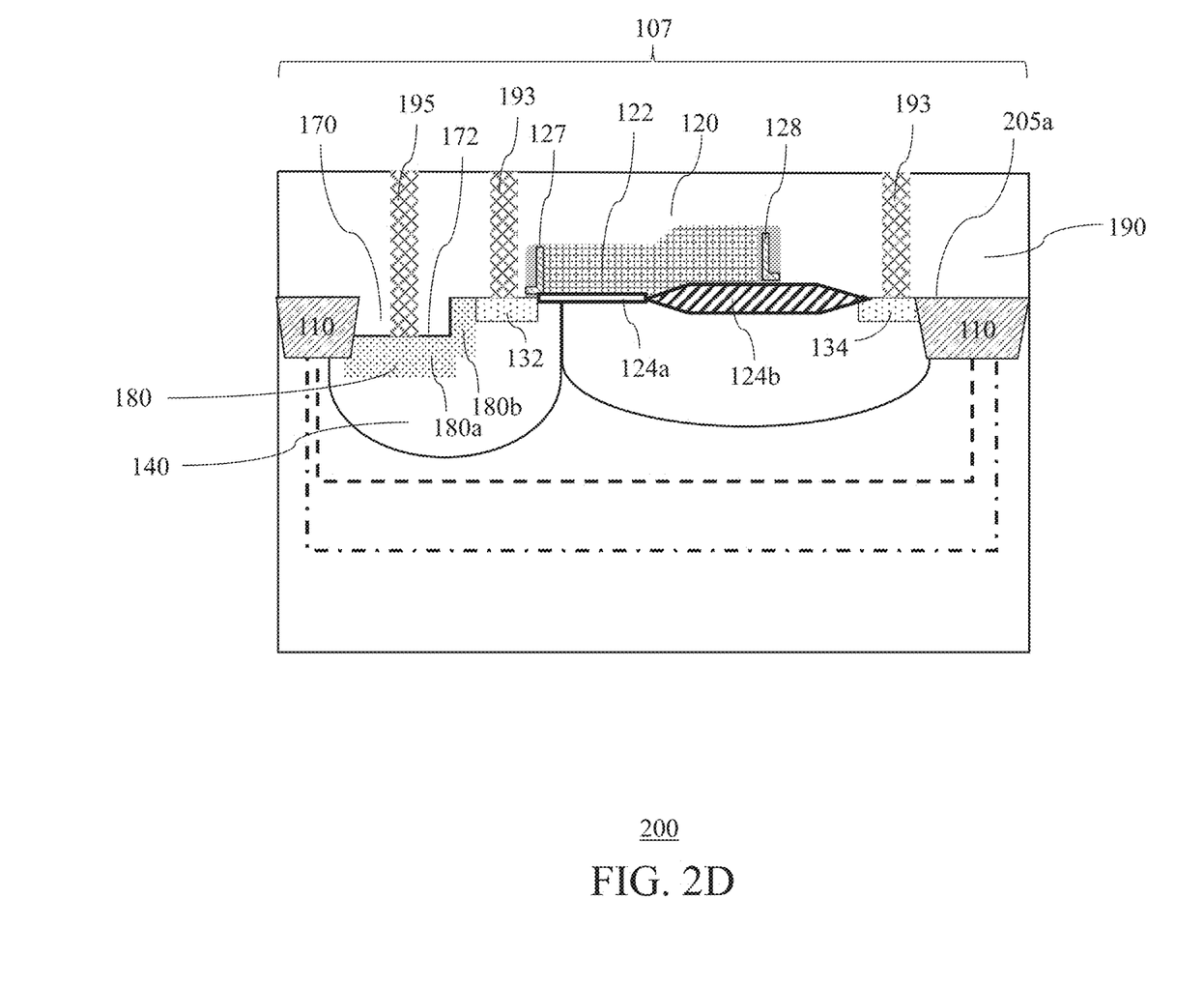

First and second gate spacers 127 and 128 may be formed over sidewalls of the gate electrode 122, as shown in FIG. 2D. The gate spacers 127 and 128 may be formed by depositing a dielectric layer over the substrate and selectively removing portions of the dielectric layer. The dielectric layer may be deposited, for example, by CVD. In a non-limiting example, the dielectric layer may include a dielectric material, such as but not limited to, silicon oxide, silicon nitride, or a combination thereof. Portions of the dielectric layer may be removed by an anisotropic etch, such as a RIE in a non-limiting embodiment. Other techniques for forming the spacers may also be useful.

A source region 132 and a drain region 134 may be formed in the substrate by ion implantation. For example, a source/drain implant mask, such as a patterned photoresist layer having openings for forming the source and drain regions may be formed over the substrate. The source region and the drain region may be formed by implanting portions of the substrate with first polarity type dopants. In a non-limiting embodiment, the source region 132 may be formed adjacent to a first side of the gate 120 and the drain region 134 may be formed spaced apart from a second side of the gate 120. As illustrated, the source region 132 may underlap a portion of the gate. In a non-limiting embodiment, the drain region 134 may abut the second gate dielectric portion 124*b*. The source/drain implant mask may be removed after forming the source and drain regions. Other techniques may also be useful for forming the source region and the drain region.

A well tap region 180 may be formed in the substrate 105 by ion implantation. For example, an implant mask having an opening to expose the portion of the substrate for forming the well tap region 180 may be formed over the substrate. For example, a well tap implant mask, such as a patterned photoresist layer having openings for forming the well tap region 180 may be formed over the substrate. The well tap region may be formed by implanting a portion of the substrate with second polarity type dopants. In a non-limiting embodiment, the well tap region 180 and the first device well 140 may have the same polarity type dopants. In a non-limiting embodiment, the well tap region 180 may be a heavily doped device well.

In a non-limiting embodiment, the implant forms the well tap region 180 within the first device well 140 in the substrate. The implant amount may range from about $1E15/cm^2$ to about $1E17/cm^2$ and the implant energy may range from about 5 Kev to about 50 Kev. Other suitable implant parameters may also be useful for forming the well tap region. The implant, in a non-limiting example, is a low tilt angled implant. In a non-limiting example, the implant may be performed at an angle ranging from about 0° to about 7° with reference to the top surface of the substrate. Other angled implants may also be useful.

As shown, the implant forms a well tap region 180 which surrounds the trench 172 of the trench structure 170. For example, the well tap region 180 is arranged at least around a bottom and a sidewall of the trench 172 (or trench structure 170). In some embodiments, the well tap region 180 may extend from the top surface of the substrate and beyond the bottom of the source region 132. In a non-limiting embodiment, the well tap region 180 may extend from the top surface of the substrate and beyond the bottom of the device isolation regions. For example, the well tap region 180 may include a first well tap portion 180*a* below the trench 172 and a second well tap portion 180*b* adjacent to the trench 172. The first well tap portion 180*a* may have a depth deeper than the second well tap portion 180*b* relative to the top substrate surface 205*a* due to the presence of the trench 172 during the implant. In other words, the implant forms the first well tap portion 180*a* such that it extends from the bottom of the trench 172 and into a portion of the substrate, and the second well tap portion 180*b* which extends from the top substrate surface 205*a* and into a portion of the substrate. Providing the trench 172 in the substrate enables the well tap region 180 to be formed deeper into the substrate. The deeper well tap region may reduce well tap resistance.

In a non-limiting embodiment, the implant forms a well tap region 180 that abuts the source region 132. In other embodiments, the implant forms a well tap region 180, which is spaced apart from the source region 132. In a non-limiting embodiment, the well tap region 180 may have a depth deeper than the source region 132 from the top surface of the substrate. Further, a bottom of the first well tap portion 180*a* may extend below a bottom of the device isolation region 110. In other words, a depth of the well tap region 180 may be deeper than a depth of the device isolation region 110 from the top surface of the substrate. Other suitable depth dimensions may also be useful. The well tap implant mask may be removed after forming the well tap region 180. Other techniques may also be useful for forming the well tap region. In some embodiments, the source region 132 and the drain region 134 may be formed first, followed by the well tap region 180. In other embodiments, the well tap region 180 may be formed first, followed by the source region 132 and the drain region 134.

In some embodiments, silicide contacts may be formed over the substrate (not shown). The silicide contacts may be formed on exposed portions of the substrate and over the gate electrode. For example, silicide contacts may be formed over the source and drain regions 132 and 134, the well tap region 180 and the gate electrode 122. To form the silicide contacts, a metal layer may be deposited over the substrate. In a non-limiting example, a metal layer may be formed over the substrate by sputtering. An anneal is performed to cause a reaction with the exposed portions of the substrate and the gate electrode. Unreacted metal is removed by, for example, a wet etch.

A dielectric layer 190 may be formed over the substrate, covering the gate 120. The dielectric layer may be formed in a BEOL processing. The dielectric layer 190, for example, may serve as a dielectric layer of an interlevel dielectric (ILD) layer. For example, the dielectric layer 190 serves as a PMD layer. The dielectric layer 190 may be formed by depositing a dielectric material such as silicon oxide. Providing other types of dielectric materials such as silicon nitride may also be useful. The dielectric layer 190 may be formed by CVD. Other techniques for forming the dielectric layer may also be useful. The dielectric layer 190 may fill the trench 172, forming the trench structure 170. Excess dielectric material may be removed by planarization, such as by CMP to form a planar top surface, in a non-limiting example. Other techniques may also be useful.

Contacts 193 and contact 195 may be formed in the dielectric layer 190. For example, vias may be formed in the dielectric layer 190 by mask and etch techniques to expose the source and drain regions and the well tap region. After the vias are formed, a conductive material may be deposited to fill the vias. The conductive material may be tungsten in a non-limiting example. Other types of conductive materials may also be useful. The conductive material may be formed by, for example, plating, such as electro or electro-less plating. Other types of conductive layers or forming techniques may also be useful. A planarization process, such as CMP, is performed to remove excess conductive material, forming contacts 193 and 195 in the dielectric layer 190.

The process continues to complete forming the device. For example, an IMD layer may then be formed over the PMD layer and conductive lines may be formed in the IMD layer. Additional processes may be performed to complete the device. Such processes may include forming additional interconnect metal levels, final passivation, dicing, packaging and testing.

Such a process enables a deeper well tap region to be formed in a HV device region by forming a trench prior to the implant step for the well tap region. The deeper well tap region may reduce well tap resistance which improves reliability of the LDMOS device to snap back and the safe operating area of the LDMOS device. Furthermore, there is no need for an additional mask to form the deeper well tap region. This simplifies the manufacturing process and optimizes the manufacturing cost.

Figure 3A:
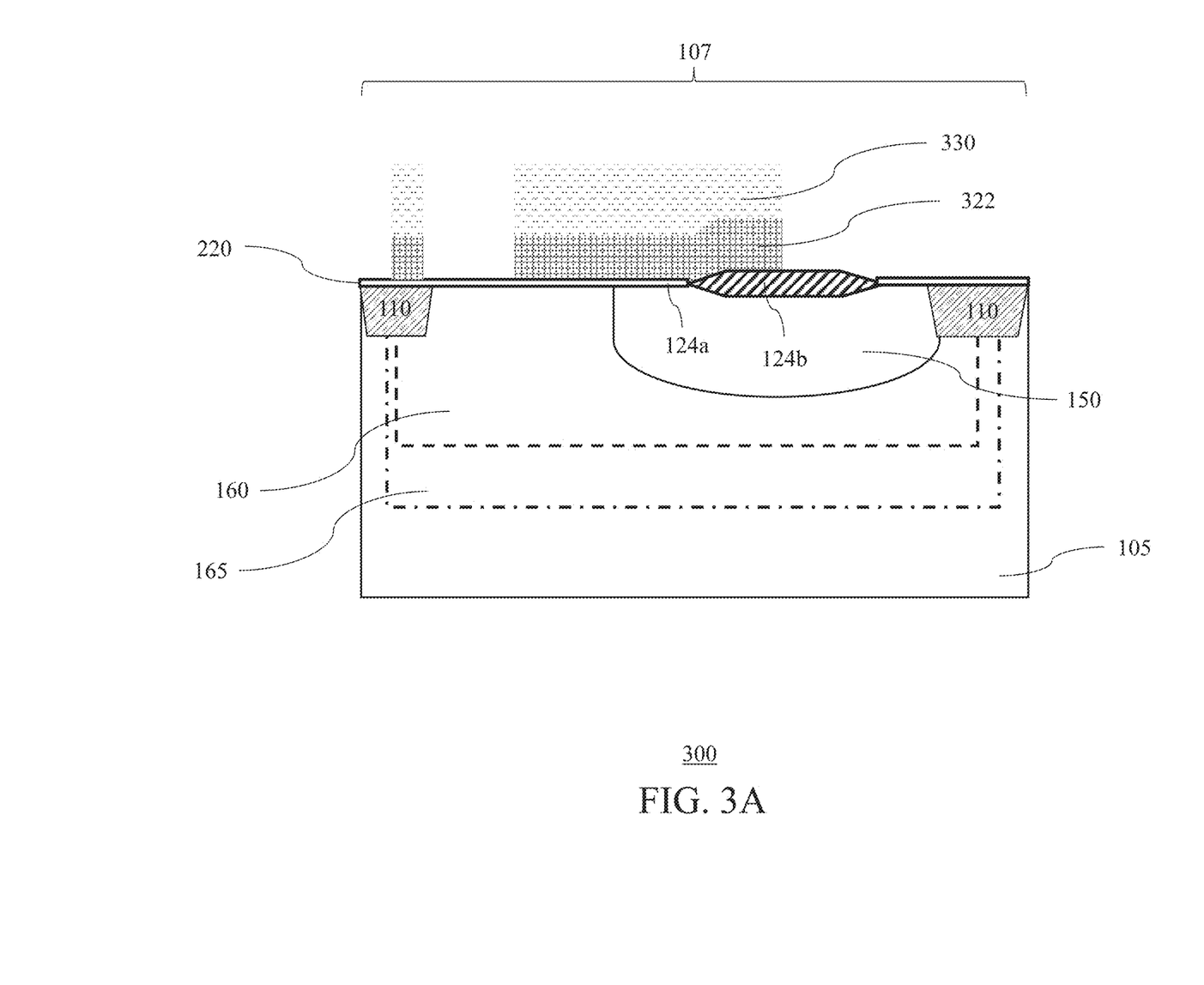
FIGS. 3A-3C show cross-sectional views of another embodiment of a process for forming a device.
Figure 3B:
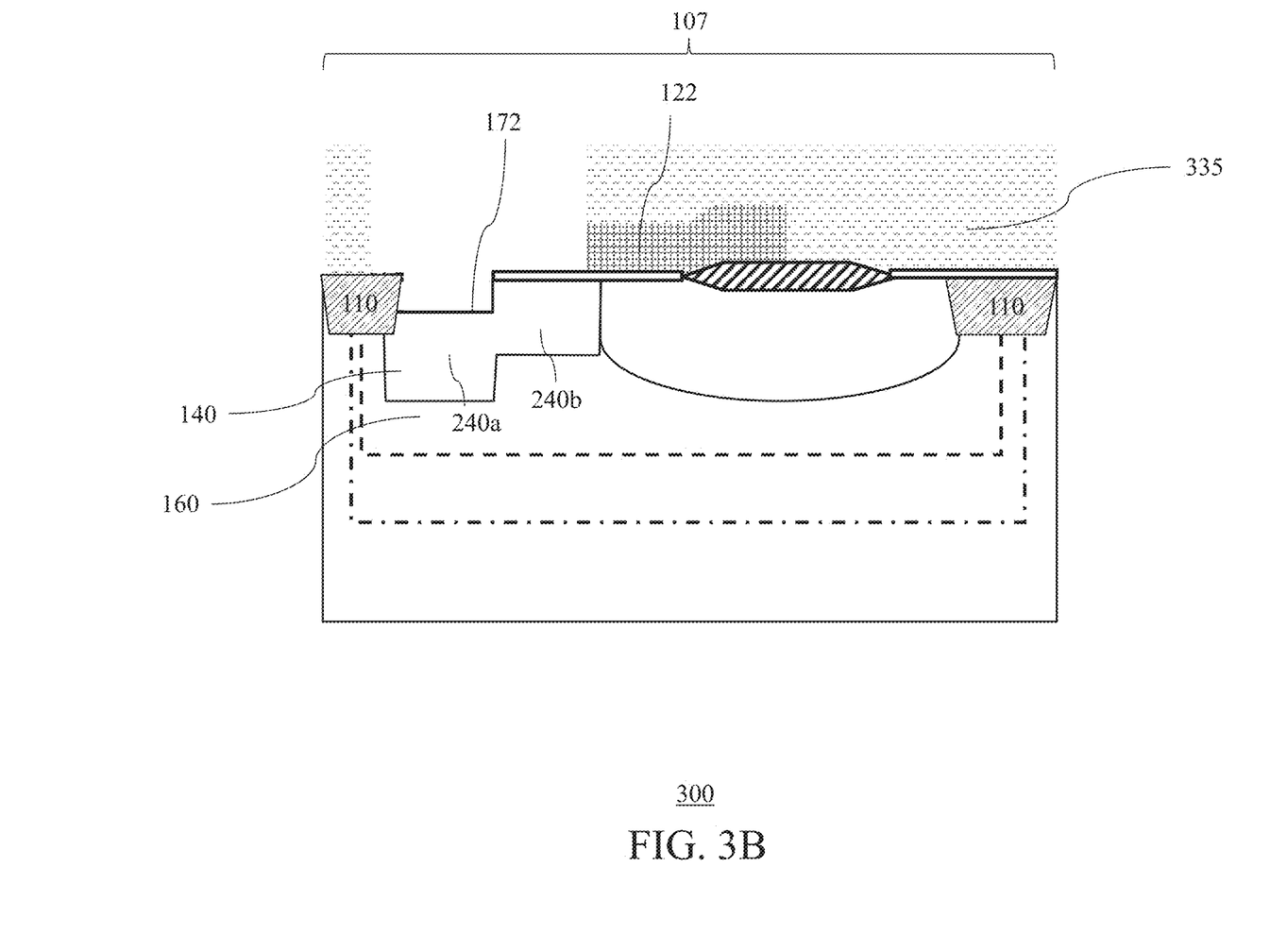
Figure 3C:
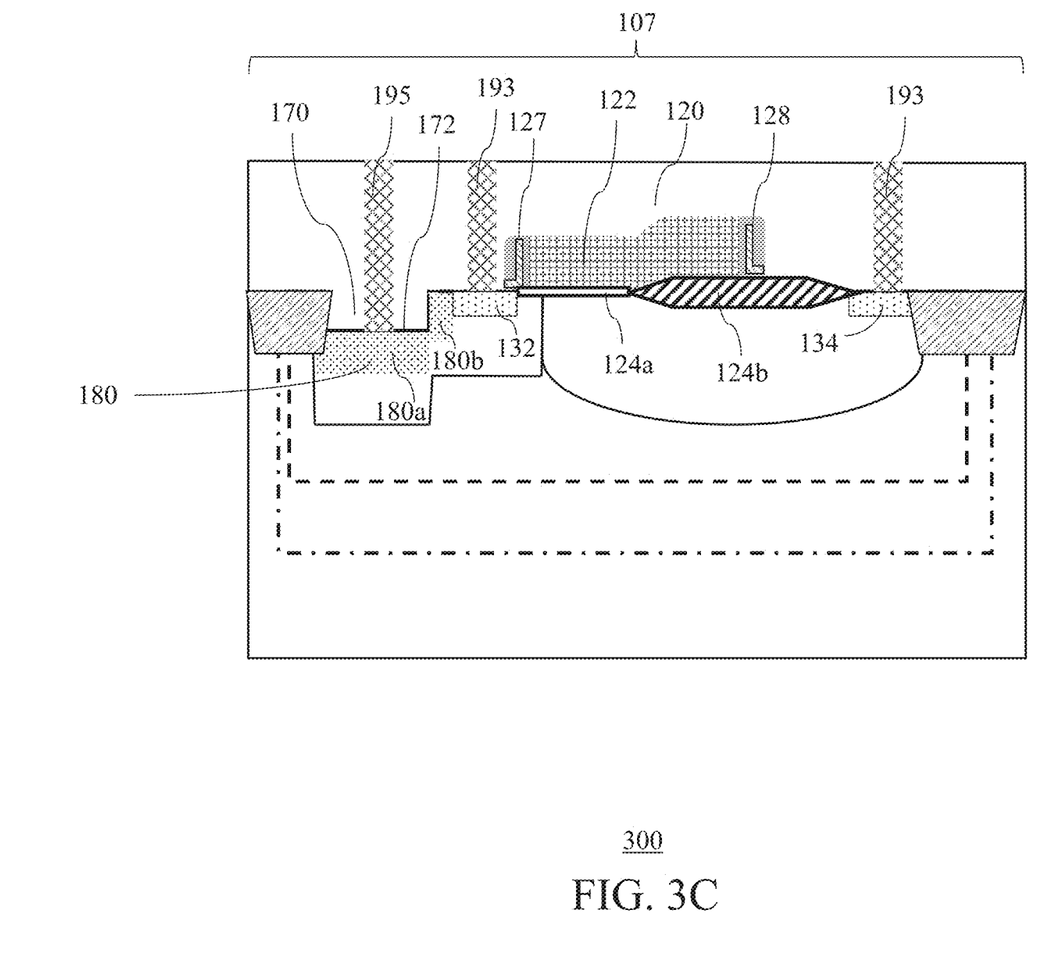

FIGS. 3A-3C show cross-sectional views of another embodiment of a process 300 for forming a device or IC. The process is similar to that described in FIGS. 2A-2D, while the device is similar to that described in FIG. 1B. As such, common features or features having the same reference numerals may not be described or described in detail.

Referring to FIG. 3A, a partially processed substrate is provided. The substrate, as shown, is at the stage of processing as described in FIG. 2B. For example, device isolation regions 110, a second device well 150, a third device well 160 and a fourth device well 165 are formed in the substrate 105. Similarly, a first gate dielectric portion 124a and a second gate dielectric portion 124b of a gate of a transistor may be formed over the substrate 105. Similar to the process 200 as described in FIG. 2B, the first gate dielectric portion 124a may be formed by growing an oxide layer 220 on the substrate using thermal oxidation. In other embodiments, CVD may be employed to deposit the oxide layer 220 such as a silicon oxide layer, in a non-limiting example.

In a non-limiting embodiment, a gate electrode layer 322 may then be formed over the substrate. The gate electrode layer 322 may be a polysilicon layer in a non-limiting example. The gate electrode layer 322 may be deposited over the substrate by CVD. Other conductive material and techniques suitable for forming the gate electrode layer may also be useful.

The gate electrode layer 322 may be patterned to remove portions of the gate electrode layer 322 in the device region 107, as illustrated in FIG. 3A. In a non-limiting embodiment, portions of the gate electrode layer 322 may be removed to partially form a gate electrode of the transistor, and to expose a portion of the substrate where a trench of a trench structure is to be formed subsequently. For example, a portion of the gate electrode layer above the subsequently formed drain region is removed. For example, a portion of the second gate dielectric portion 124b may be exposed after patterning of the gate electrode layer 322.

In a non-limiting embodiment, a mask and etch technique may be employed to pattern the gate electrode layer 322. In some embodiments, patterning of the gate electrode layer 322 to partially form the gate electrode of the transistor as well as to remove the portion of the gate electrode layer above the subsequently formed trench in the device region 107 may be performed simultaneously with patterning other regions of the substrate 105 (e.g., gate electrode patterning for input output device region and core device region). A gate mask 330, such as a patterned photoresist layer may be formed over the substrate 105. The gate mask 330 exposes portions of the gate electrode layer which are to be removed. Exposed portions of the gate electrode layer may be removed, for example, by an anisotropic etch such as a RIE. Other techniques for etching may also be useful. The gate mask may be removed, for example, by ashing in the case of a photoresist layer. Other suitable techniques for removing the gate mask may also be useful.

In a non-limiting embodiment, a first device well 140 may be formed in the substrate, as illustrated in FIG. 3B. The first device well 140 may serve as a body well of the transistor. A first device well implant mask 335, such as a patterned photoresist layer may be formed over the substrate 105. The patterned photoresist layer may include an opening that corresponds to a region of the substrate where the first device well 140 is to be formed. In a non-limiting embodiment, the first device well implant mask exposes a portion of the gate electrode layer on a source side of the transistor to fully form the gate electrode 122, as well as portion of the substrate 105 to form the trench 172, as illustrated in FIG. 3B. In other words, the first device well implant mask 335 may be used to pattern the gate electrode layer to remove the portion of the gate electrode layer over a subsequently formed source region of the transistor, and to pattern substrate 105 to form the trench 172. Portions of the gate electrode layer and the substrate exposed by the first device well implant mask may be removed, for example, by an anisotropic etch, such as a RIE.

As illustrated in FIG. 3B, a portion of the gate electrode layer over a source region, which is to be formed subsequently, may be removed using the first device well implant mask 335. Additionally, the trench 172 of the trench structure may be formed in the substrate 105 during patterning of the portion of the gate electrode layer over the source region to form the gate electrode 122. In a non-limiting embodiment, the trench of the trench structure may be formed simultaneously in the substrate 105 during patterning of the portion of the gate electrode layer over the source region to form the gate electrode 122.

The first device well 140 may then be formed in the substrate. In a non-limiting embodiment, an ion implantation process may be performed to form the first device well 140. The implant, in a non-limiting example, is a high tilt angled implant. The first device well 140 may be formed by implanting the exposed portion of the substrate with second polarity type dopants, in a non-limiting example. In a non-limiting embodiment, the first device well 140 and the third device well 160 may have the same polarity type dopants. In a non-limiting embodiment, the first device well 140 may be a lightly or intermediately doped device well. The implant amount may range from about $1E13/cm^2$ to about $5E14/cm^2$ and the implant energy may range from about 50 Kev to about 500 Kev in a non-limiting embodiment. Other suitable implant parameters may also be useful for forming the first device well. The implant may be angled to form the first device well 140. In a non-limiting example, the implant may be performed at an angle ranging from about 15° to about 45° with reference to the top surface of the substrate. Other angled implants may also be useful. The angled implant may form a first device well 140, which extends under a portion of the gate electrode 122.

As shown, the first device well 140 may extend from the top surface of the substrate to the bottom of the device isolation regions, in a non-limiting embodiment. In a non-limiting embodiment, the first device well 140 may have a dopant profile that follows the profile of the trench 172 of trench structure and the top surface of the substrate. For example, the implant may form the first device well 140 having a first device well portion 240a below the trench 172 and a further first device well portion 240b adjacent to a sidewall of the trench 172, as illustrated in FIG. 3B. Providing the trench 172, prior to forming the first device well 140, may enable the first device well to be formed with different portions having different depths. The first device well portion 240a may have a depth deeper than a depth of the further first device well portion 240b relative to the top surface of the substrate. For example, providing the trench 172, prior to forming the first device well 140, may enable a deeper first device well to be formed in the substrate. In a non-limiting example, the first device well portion 240a may have a depth ranging from about 0.8 um to about 1.5 um, while the further first device well portion 240b may have a depth ranging from about 0.5 um to about 1 um relative to the top surface of the substrate. Other suitable depth dimensions may also be useful. The first device well implant mask 335 may be removed, for example, by ashing in the case of a photoresist layer. Other suitable techniques for removing the first device well implant mask may also be useful.

The formation of the device in the device region 107 may be completed and look similar to that depicted in FIG. 2D. For example, first and second gate spacers 127 and 128 may be formed over sidewalls of the gate electrode 122, as shown in FIG. 3C. Additionally, a source region, a drain region 134 and a well tap region 180 may be formed in the substrate 105. As shown, the well tap region 180 surrounds the trench 172 of the trench structure 170. For example, the well tap region 180 may be arranged at least around a bottom and a sidewall of the trench 172 (or trench structure 170). Similarly, the well tap region 180 may include a first well tap portion 180a below the trench 172 and a second well tap portion 180b adjacent to the sidewall of the trench 172.

Silicide contacts may be formed over the substrate (not shown). A dielectric layer 190 may be formed over the substrate, covering the gate 120 of the transistor. For example, the dielectric layer 190 may fill the trench 172, forming the trench structure 170. Additionally, contacts 193 and contact 195 may be formed in the dielectric layer 190. The process continues to complete forming the device. Such processes may include forming additional interconnect metal levels, final passivation, dicing, packaging and testing.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising: a substrate having a device region; a source region and a drain region disposed in the substrate within the device region; a gate arranged over the substrate and between the source region and the drain region; a trench structure having a trench disposed in the substrate within the device region, the trench being filled with dielectric material, wherein the trench structure is arranged on a first side of the gate where a predetermined distance is arranged between the trench structure and the first side of the gate; and a well tap region disposed adjacent to the source region, wherein the well tap region comprises a first well tap portion arranged below the trench and which extends along a flat bottom surface of the trench, wherein the well tap region is further arranged along a sidewall of the trench such that the well tap region surrounds the trench structure, wherein at least the first well tap portion of the well tap region has a deeper depth within the substrate as compared to the source region; and a contact extending through the dielectric material in the trench to contact the well tap region.

2. The device of claim 1, wherein the well tap region abuts the source region.

3. The device of claim 2, wherein a predetermined distance is arranged between the trench structure and the source region.

4. The device of claim 1, further comprising a first device well disposed in the substrate within the device region, wherein the first device well surrounds the source region and the well tap region, and extends at least partially under a first portion of the gate.

5. The device of claim 4, further comprising a second device well disposed in the substrate within the device region, wherein the second device well surrounds the drain region and extends at least partially under a second portion of the gate, wherein the second device well serves as a drift well.

6. The device of claim 5, wherein the second device well comprises first polarity dopants, and wherein the well tap region and the first device well comprise second polarity type dopants different from the first polarity type dopants.

7. The device of claim 6, further comprising a third device well having second polarity type dopants in the substrate within the device region, wherein the third device well surrounds the first device well and the second device well.

8. The device of claim 6, wherein the source region and the drain region comprise first polarity type dopants.

9. The device of claim 4, wherein the first device well comprises a first device well portion below the trench and a further first device well portion adjacent to a sidewall of the trench, the first device well portion having a depth deeper than a depth of the further first device well portion from a top surface of the substrate.

10. The device of claim 1, further comprising one or more device isolation regions disposed in the substrate, wherein the one or more device isolation regions surround the device region.

11. The device of claim 10, wherein the well tap region abuts one or more of the device isolation regions and wherein the well tap region has a deeper depth as compared to the one or more device isolation regions.

12. The device of claim 1, further comprising a fourth device well having first polarity type dopants in the substrate within the device region, wherein the fourth device well surrounds a third device well.

13. The device of claim 1, wherein the well tap region further comprises a second well tap portion arranged along a sidewall of the trench, wherein the first well tap portion below the trench has a depth in the substrate which is deeper than a depth of the second well tap portion extending from a top surface of the substrate.

14. A device comprising:
a substrate having a device region;
a source region and a drain region disposed in the substrate within the device region;
a gate arranged over the substrate and between the source region and the drain region;
a trench structure having a trench disposed in the substrate within the device region, wherein the trench structure is arranged on a first side of the gate where a predetermined distance is arranged between the trench structure and the first side of the gate; wherein the deepest depth of the trench structure is deeper than the deepest depth of the source region from a top surface of the substrate; and
a well tap region disposed adjacent to the source region, wherein the well tap region extends along at least portion of a bottom surface of the trench structure, wherein the well tap region is further arranged along a sidewall of the trench such that the well tap region surrounds the trench structure, wherein the well tap region has a deeper depth within the substrate as compared to the source region.

* * * * *